United States Patent [19]

Moran et al.

[11] Patent Number: 4,697,147

[45] Date of Patent: Sep. 29, 1987

[54] BLOOD FLOW IMAGING USING A CW NMR TECHNIQUE

[75] Inventors: Paul R. Moran, Winston-Salem, N.C.; Richard E. Halbach, Brookfield, Wis.

[73] Assignee: Metriflow, Inc., Milwaukee, Wis.

[21] Appl. No.: 799,848

[22] Filed: Nov. 14, 1985

[51] Int. Cl.$^4$ .................... G01R 33/20; G01N 24/08
[52] U.S. Cl. ..................................... 324/306; 324/309
[58] Field of Search ............... 324/309, 306, 307, 308, 324/311, 312, 314; 128/653

[56] References Cited

U.S. PATENT DOCUMENTS

| | | | |
|---|---|---|---|
| 3,473,108 | 10/1969 | McCormick | 324/306 |
| 3,932,805 | 1/1976 | Abe et al. | 324/309 |
| 4,516,075 | 5/1985 | Moran | 324/309 |
| 4,565,968 | 1/1986 | Macovski | 324/309 |
| 4,613,818 | 9/1986 | Battocletti et al. | 324/306 |

OTHER PUBLICATIONS

"The NMR Blood Flowmeter-Theory and History" by J. H. Battocletti et al, *Medical Physics*, vol. 8, No. 4, Jul./Aug. 1981.
P. R. Moran, A Flow ... Humans, Magnetic Resonance Imaging, vol. 1, 1982, pp. 197-203.

*Primary Examiner*—Stewart J. Levy
*Assistant Examiner*—Scott M. Oldham
*Attorney, Agent, or Firm*—Quarles & Brady

[57] ABSTRACT

An NMR blood flowmeter applies a continuous transverse excitation signal and a constant, homogeneous polarizing magnetic field to blood flowing through an active region. The polarizing magnetic field is contoured at opposite boundaries of this active region, and by switching these contours and collecting the resulting NMR signals, data is obtained from which the various components of blood flow may be calculated.

8 Claims, 14 Drawing Figures

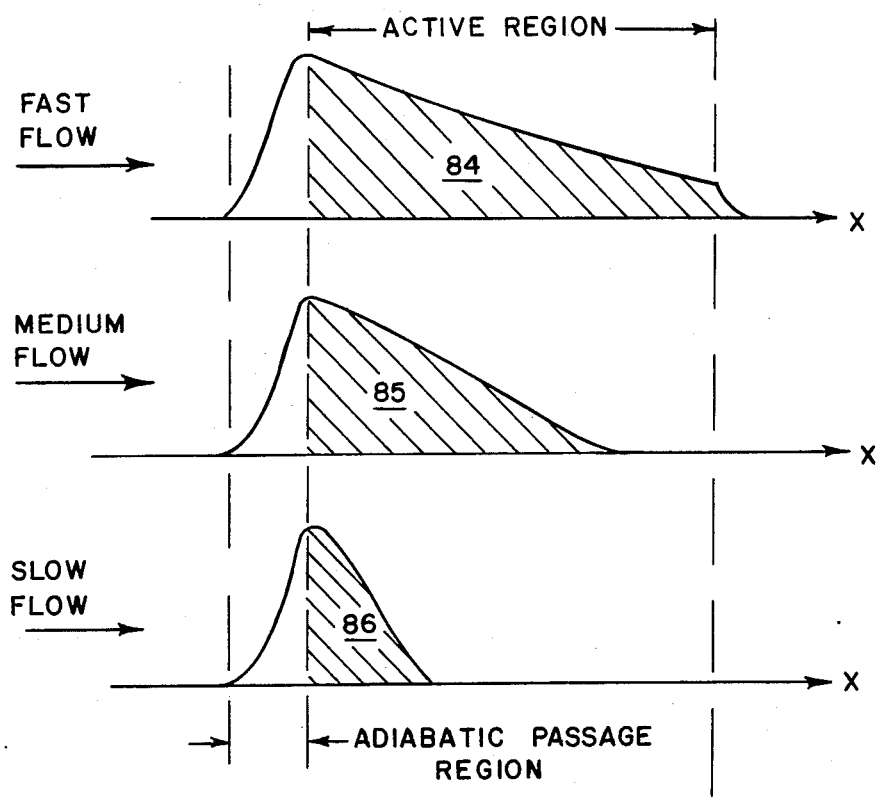
FIG. 5a
FIG. 5b
FIG. 5c
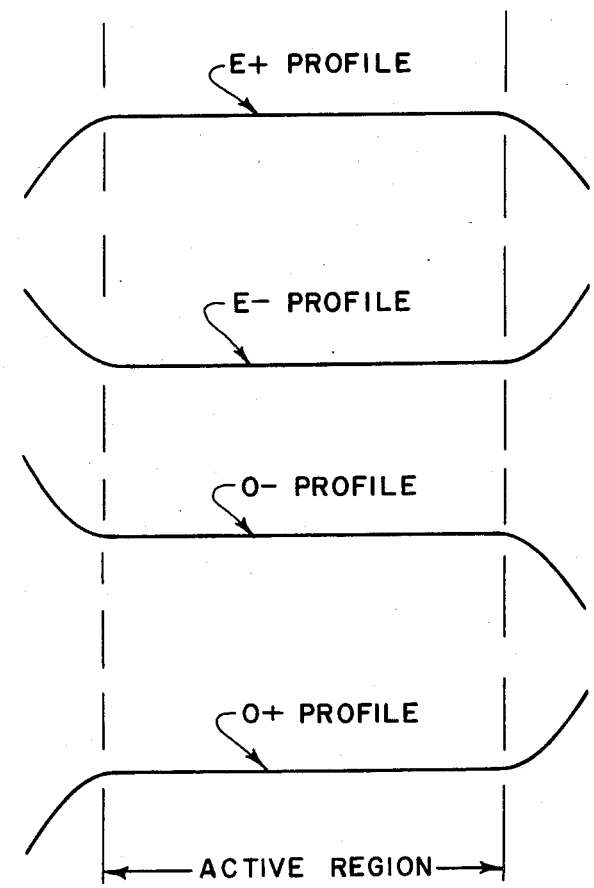
FIG. 6a
FIG. 6b
FIG. 6c
FIG. 6d

BLOOD FLOW IMAGING USING A CW NMR TECHNIQUE

BACKGROUND OF THE INVENTION

The field of the invention is gyromagnetic resonance spectroscopy, and particularly, nuclear magnetic resonance (NMR) techniques for measuring flow.

Gyromagnetic resonance spectroscopy is conducted to study nuclei that have magnetic moments and electrons which are in a paramagnetic state. The former is referred to in the art as nuclear magnetic resonance (NMR), and the latter is referred to as paramagnetic resonance (EPR) or electron spin resonance (ESR). There are other forms of gyromagnetic spectroscopy that are practiced less frequently, but are also included in the field of this invention.

Any nucleus which possesses a magnetic moment attempts to align itself with the direction of the magnetic field in which it is located. In doing so, however, the paramagnetic nucleus precesses around this direction at a characteristic angular frequency (Larmor frequency) which is dependent on the strength of the magnetic field and on the properties of the specific nuclear species (the magnetogyric constant of the nucleus).

When a substance such as human tissue is subjected to a uniform magnetic field (polarizing field $B_z$) the individual magnetic moments of the paramagnetic nuclei in the tissue attempt to align with this field, but precess about it in random order at their characteristic Larmor frequency. A net magnetic moment M is produced in the direction of the polarizing field but the randomly oriented components in the perpendicular plane (x-y plane) cancel one another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency. The degree to which the rotation of $M_z$ into an $M_1$ component is achieved, and hence, the magnitude and the direction of the net magnetic moment ($M=M_z+M_1$) depends primarily on the length of time of the applied excitation field $B_1$.

The practical value of this gyromagnetic phenomena resides in the radio frequency signal which is emitted as a result of the net transverse magnetic moment $M_1$. One commonly used technique, referred to in the art as a "pulsed NMR measurement", applies the excitation field $B_1$ for a short interval, and then receives the signal that is produced by the resulting transverse magnetic moment $M_1$. Such pulsed NMR measurement cycles may be repeated many times to make the same measurement at different locations in the subject or to make different measurements using any of a number of preparative excitation techniques. For example, in my U.S. Pat. No. 4,516,075 I disclose how a bipolar magnetic field gradient may be applied between the excitation of the gyromagnetic material and the receipt of the subsequent radio frequency emission to "sensitize" the emitted signal to indicate the direction and magnitude of fluid flow. When combined with imaging techniques such as that referred to as "zeugmatography", two dimensional images indicating the magnitude of fluid flow may be produced using this pulsed NMR technique.

Another common NMR technique which has been employed to measure the flow of fluids applies a continuous excitation field $B_1$ to the gyromagnetic material. A paper "The NMR Blood Flowmeter-Theory and History" by J. H. Battocletti et al., published in *Medical Physics* Vol. 8, No. 4, July/August, 1981, describes the theory and history of this effort. Such "CW" techniques employ special NMR apparatus with coils arranged to magnetize a sample of the fluid "upstream" of the coils which are employed to sense the emission signal. The physical distance between this "tagging" coil and the sensing coil is known, and the level of the emission signal provides velocity information in the direction of fluid flow. An apparatus for measuring blood flow in this manner and producing two dimensional images is disclosed in U.S. Pat. No. 4,613,818 entitled "Nuclear Magnetic Resonance Blood Flowmeter".

While CW NMR techniques are effective for measuring pulsatile flow, or for measuring continuous flow in well defined structures such as pipes, they have not been entirely satisfactory for measuring blood flow which has both continuous and pulsatile components and which is contained in irregular shaped vessels.

SUMMARY OF THE INVENTION

The present invention relates to a method and means for measuring the components of blood flow, including venous flow, constant arterial flow and pulsatile arterial flow. More specifically, the present invention relates to a CW NMR blood flowmeter in which the polarizing magnetic field $B_O$ is contoured such that flowing paramagnetic nuclei approach an active region from a region of either higher or lower polarizing magnetic field and the polarity of the NMR signal produced in the active region is determined by the contour. By switching the polarizing magnetic field contours, a series of NMR signals are produced and arithmetically combined to indicate the magnitude of the separate blood flow components.

A general object of the invention is to accurately measure the components of blood flow. The magnitude of the NMR signal produced by the paramagnetic nuclei in the blood as it flows through the active region is a function of the volume and velocity of flow. By switching the polarizing magnetic field contours at each boundary of the active region, the polarity of the NMR signals produced by the various components of flowing blood can be switched. By digitizing and storing such signals, they can be arithmetically combined in such a manner as to calculate the magnitude of the separate blood flow components, such as venous flow, constant arterial flow, and pulsatile arterial flow.

Yet another object of the invention is to cancel the NMR signals produced by stationary tissues and anomalies inherent in the NMR hardware. Paramagnetic nuclei which are stationary remain in the active region as the measurements are made with the various polarizing magnetic field contours, and the polarity of the NMR signal which they produce is not switched. The same is true of NMR signals produced by anomalies in the hardware. As a result, these NMR signals can be cancelled by judiciously subtracting the digitized NMR data. The result is an NMR signal which indicates only the magnitude of flowing paramagnetic nuclei.

The foregoing and other objects and advantages of the invention will appear from the following description. In the description, reference is made to the accompanying drawings which form a part hereof, and in which there is shown by way of illustration a preferred

BRIEF DESCRIPTION OF THE DRAWINGS

FIGS. 5a–5c are graphic representations of the NMR signals produced by blood flowing at different velocities through the flowmeter of FIG. 1; and FIGS. 6a–6d are graphic representations of the four polarizing magnetic field profiles which are produced by the flowmeter of FIG. 1.

DESCRIPTION OF THE PREFERRED EMBODIMENT

Figure 1:
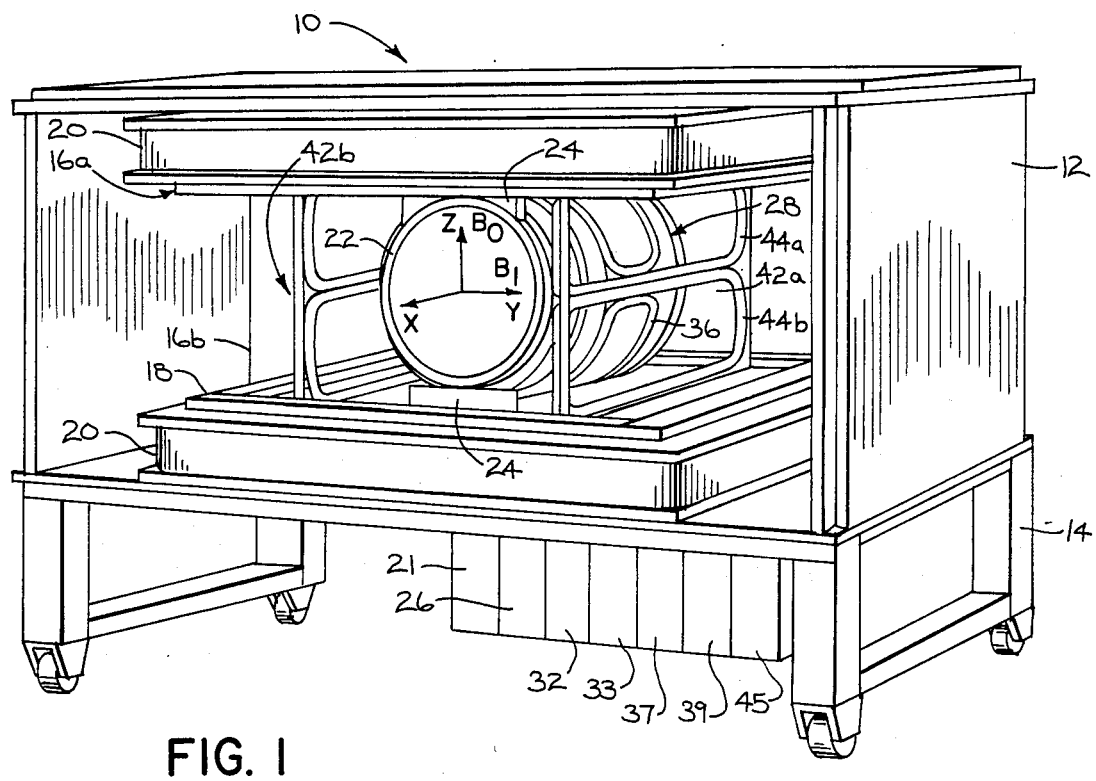
FIG. 1 is a perspective view of the preferred embodiment of the NMR blood flowmeter.

A nuclear magnetic resonance blood flowmeter 10 includes a rectangular steel shell 12 which is supported by a cart 14. Within shell 12 is a pair of polarizing magnets 16a and 16b which are located on the top and bottom interior surfaces, respectively, of the shell 12. Each of the magnets 16a and 16b is comprised of a magnetic pole piece fabricated from ceramic permanent magnet material, such as ceramic Type 5 or Type 8, and the magnets 16a and 16b produce a constant polarizing magnetic field $B_O$ in a cylindrical lumen 22. This field is directed along the vertical, or z axis.

As shown in FIG. 1, to insure homogeneity of the polarizing field $B_O$ throughout a "region of interest" within the lumen 22, a magnetic shim 18, consisting of a steel ring, is placed on the pole face of each of the magnets 16a and 16b. In addition, to stabilize the polarizing magnetic field $B_O$ at a magnitude which produces the proper Larmor resonant frequency in the paramagnetic nuclei, a pair of trim coils 20 are provided. One trim coil 20 is wound around each of the magnets 16a and 16b and they are energized by a field controller circuit 21 mounted beneath the cart 14. The field produced by the coils 20 compensates for variations in the magnetic field produced by the permanent magnets 16a and 16b caused by changes in temperature or the like.

Referring still to FIG. 1, the lumen 22 is a non-magnetic cylinder which is held between magnets 16a and 16b by chocks 24. Lumen 22, is manufactured from a PVC pipe having a 20.3 centimeter internal diameter and 0.5 centimeter thick walls. The dimensions of the lumen 22 are chosen to enable it to support a human limb between the permanent magnets 16a and 16b.

A nuclear magnetic resonance response is induced in the blood flowing through the limb by a transmitter 26 whose output signal is supplied to a transmitter coil 28 which circumscribes lumen 22. Transmitter 26 is packaged within an enclosure physically mounted to cart 14 beneath shell 12 so as to be adjacent to a field controller circuit 21. As will be described in more detail below, the transmitter coil 28 produces a transverse excitation field $B_1$ which magnetizes the paramagnetic nuclei in the flowing blood. Transmitter coil 28 is wound so that the direction of the excitation field $B_1$ is perpendicular to both the lumen axis and to the polarizing magnetic field $B_O$.

The nuclear magnetic resonance (NMR) response is detected by a receiver coil 30 (not shown in FIG. 3) which is coupled to a receiver 32 mounted beneath the shell 12. The receiver coil 30 is wound about the lumen 22 so that the axis of the field which induces a signal into the receiver coil 30 is perpendicular to the axis of the excitation field $B_1$ produced by transmitter coil 28 and is perpendicular to the polarizing magnetic field $B_O$. By orienting the transmitter and receiver coils so that their respective fields are orthogonal to each other, the mutual inductance of the coils is minimized and a high degree of isolation between the coils is achieved. This is necessary in a CW system, since the excitation field $B_1$ is applied continuously and at the same time as the NMR response is received.

In addition to the transmitter and receiver coils, a modulation coil 36 (FIG. 3) is also wrapped about the lumen 22. The field generated by the modulation coil 36 is parallel to the polarization magnetic field $B_O$, and it is energized by a modulator 37 which is disposed within an enclosure mounted beneath the shell 12. The modulation field $B_m$ produced by the modulation coil 36 has a frequency of approximately 8 kHz, and it is employed to produce discrete sidebands on the magnetization response spectrum on each side of the Larmor frequency. In this manner, the excitation field ($B_1$) frequency may be offset 8 kHz from the frequency of the NMR response received at receiver coil 30. This enables a further reduction in cross coupling between the transmitter and receiver coils.

Referring to FIG. 1, the NMR blood flowmeter 10 also includes two sets of horizontal scanning coils 42a and 42b which are located on opposite sides of the lumen 22. Each horizontal scanning coil set includes a pair of coils 44a and 44b which are disposed one above the other and they are energized by a scanner circuit 45 to produce a magnetic field in the direction of the polarization field $B_O$, but with a gradient along the horizontal (Y) axis. Similarly, a set of vertical scanning coils 46a and 46b (FIG. 3) are located respectively along the top and bottom of the lumen 22 and they are also energized by the scanner circuit 45 to produce a magnetic field in the direction of the polarizing magnetic field $B_O$, but with a gradient in the vertical (z) axis.

As explained in detail in the above-cited U.S. Pat. No. 4,613,818, the gradient fields $G_y$ and $G_z$ produced by the horizontal and vertical scanning coils 44 and 46 are controlled to produce the proper total polarizing magnetic field $B_O$ only along a single line parallel to the axis of the lumen 22 (x axis). By adjusting these gradient fields $G_y$ and $G_z$ this line can be moved around within the lumen 22 to produce a series of NMR signals which can be processed to produce a two dimensional image of the paramagnetic nuclei flowing along the axis of the lumen 22.

Figure 2:
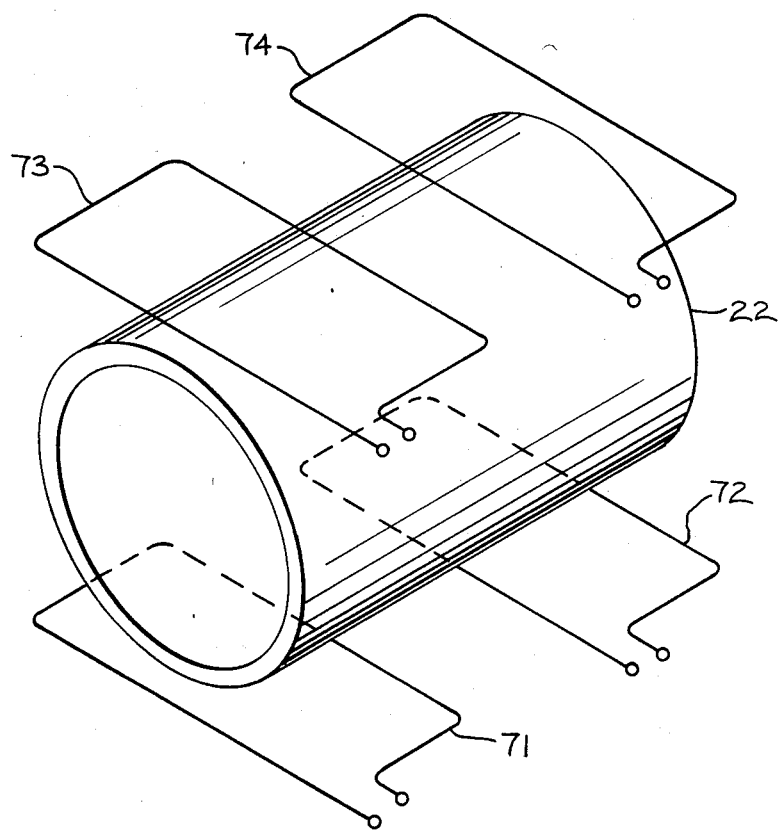
FIG. 2 is a perspective view of the field contour coils which form part of the flowmeter of FIG. 1.

Referring particularly to FIG. 2, the region of interest is a cylindrical volume located along the central axis (x axis) of the lumen 22 and midway between its ends. It has a length of approximately six centimeters. At one boundary of this region of interest a pair of field contour coils 71 and 73 are positioned, with one being located above the lumen 22 and the other below the lumen 22. A similar set of field contour coils 72 and 74 are located at the other boundary of the field of interest. The field contour coils 71 and 73 are energized to produce a magnetic field (approximately 2 gauss) in the direction of the polarizing field $B_O$ (Z axis) at one boundary, and the field contour coils 72 and 74 are separately operated to produce a similar magnetic field at the other boundary. The polarity of the currents flowing through the coil pairs 71-73 and 72-74 may be reversed to provide a magnetic field which adds to or subtracts from the polarizing field of $B_O$ at the respective boundaries.

The magnetic fields produced by the above-described coils are controlled by solid-state electronic control circuits to carry out the flow measurement technique of the present invention. This circuitry is shown in block diagram form in FIG. 3 and a majority of it will now be described in general terms. For a complete description of this circuitry, reference is made to the above-cited U.S. Pat. No. 4,613,818, which is incorporated herein by reference. The present invention requires the addition of the coils 71-74 and the profile control circuit 75 to the prior structure and they will be described in more detail below.

Figure 3:
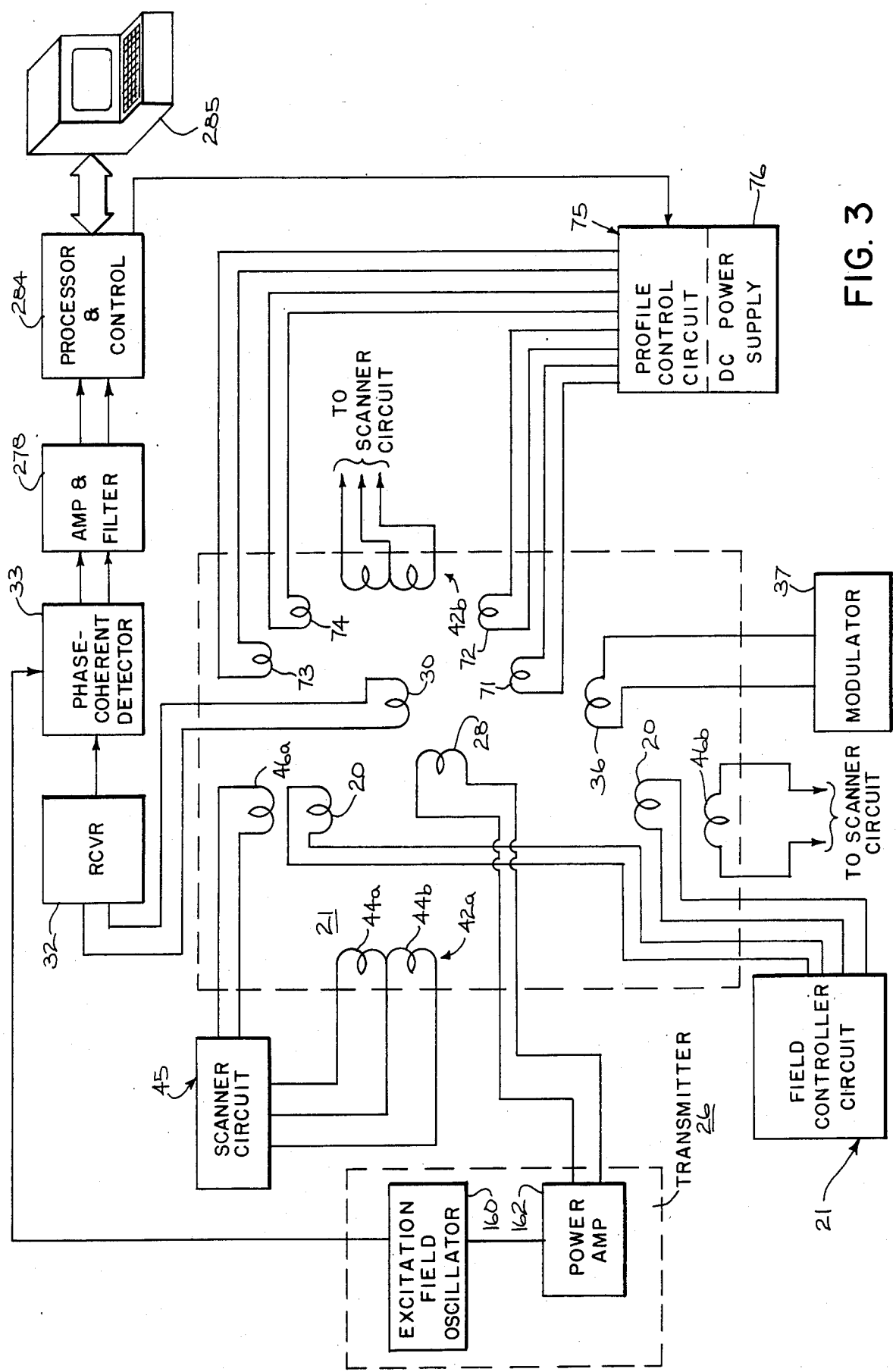
FIG. 3 is an electrical block diagram of the electronic circuitry which operates the flowmeter of FIG. 1.

Referring particularly to FIG. 3, the transmitter 26 includes an excitation field oscillator 160 which produces a sinusoidal drive voltage at the Larmor frequency or on one of its 8 kHz sideband frequencies. This excitation signal is amplified by a power amplifier 162 and is applied continuously (i.e. CW) to the transmitter coil 28 to produce the transverse excitation field $B_1$.

The receiver coil 30 is responsive to the NMR signal which is generated by the resulting transverse magnetic moment $M_1$ produced and precessing in the flowing paramagnetic nuclei. This signal is amplified by a receiver 32 which is tuned to the Larmor frequency or one of its 8 kHz sidebands, and the resulting radio frequency signal is then applied to a phase-coherent detector 33. The phase-coherent detector 33 produces two analog voltages at its outputs which are amplified and filtered at 278 and are then applied to analog inputs on a digital processor and control system 284. One of these analog signals indicates the amplitude of the NMR signal induced in the receiver coil 30 which is in phase with the excitation field $B_1$ and the other analog signal indicates the amplitude of the NMR signal which is in quadrature with the excitation field $B_1$. The processor 284 digitizes these signals and processes them to indicate flow as will be described in more detail below. When combined with position information, the resulting flow signals can be employed to produce a two dimensional image of flow through the region of interest. This image is displayed on a CRT terminal 285.

The field contour coils 71-74 are connected to a profile control circuit 75 which receives dc power from a power supply 76 and control information from the processor and control circuit 284. Each coil 71-74 is driven by a power amplifier which receives an analog command signal from the output of a digital to analog (D/A) converter. The digital input to each D/A converter is a binary number which is produced by the processor 284 and which indicates both the magnitude and the polarity of the dc current which is to be applied to each coil 71-74. As will be described in more detail below, the profile control circuit 75 receives a series of digital numbers which separately control the magnitude and polarity of the magnetic fields produced by the coils 71-74 to carry out the present invention.

Figure 4A:
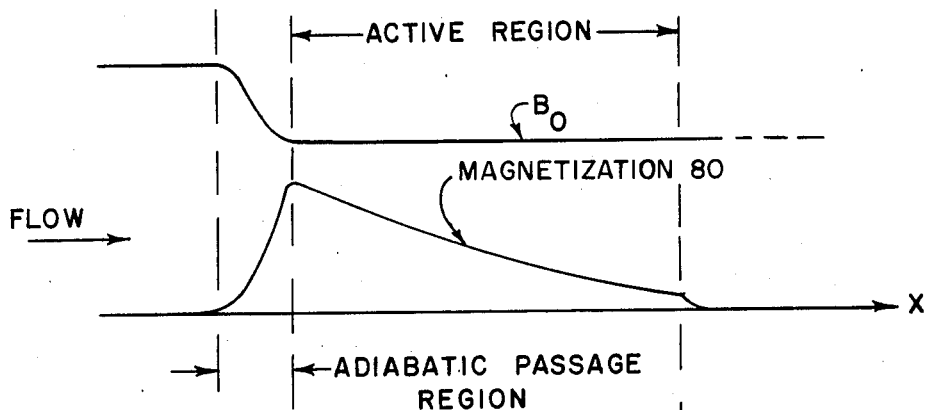
FIGS. 4a–4d are graphic representations of the NMR signals produced by four different polarizing magnetic field profiles.
Figure 4B:
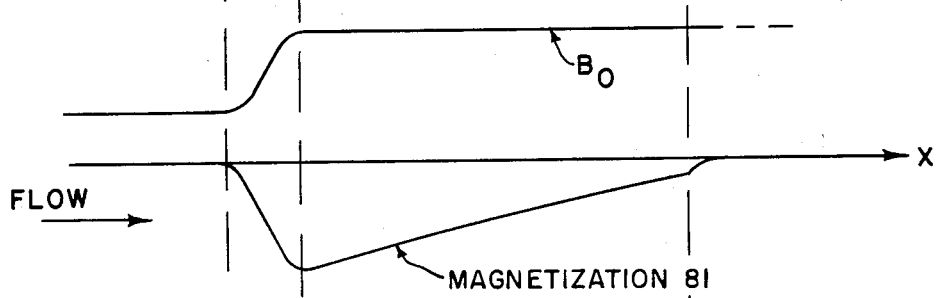

Referring particularly to FIGS. 4a and 4b, when paramagnetic nuclei flow through the active region in the lumen 22 from left to right, the polarity of the NMR signal (S(x)) which is produced will depend on the profile of the polarization magnetization $B_O$. In the active region the polarization magnetization $B_O$ has a value which causes resonance at the frequency of the transverse magnetization field $B_1$. As a result, a transverse magnetic moment $M_1(x)$ is produced and this induces the NMR signal S(t) in the receiver coil 30. If this resonance is approached adiabatically from a region in which the flowing paramagnetic nuclei are subjected to a higher polarization field $B_O$ (FIG. 4a), then the resulting excited magnetization $M_1(x)$ indicated at 80 has a positive polarity. On the other hand, if resonance is approached adiabatically from a region of lower strength polarization field $B_O$ (FIG. 4B), then the excited magnetization $M_1(x)$ has a negative polarity as indicated at 81. If all other conditions are the same, the NMR signals produced by the excited magnetizations 80 and 81 are identical except for their polarity. The adiabatic passage region in this instance is on the left-hand boundary of the active region, since this is the direction from which the paramagnetic nuclei are entering. To insure adiabatic passage, the change in strength of the polarization field $B_O$ in this passage region should be less than 10 gauss per centimeter for blood velocities normally encountered in humans.

Figure 4C:
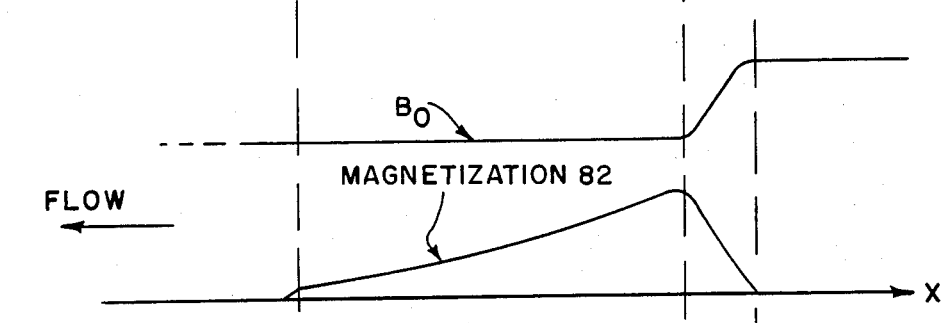
Figure 4D:
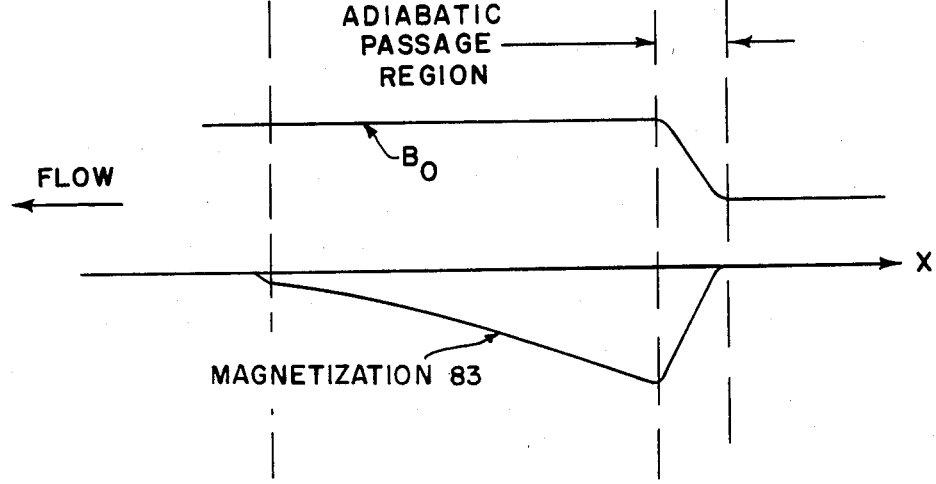

If the direction of flow is reversed through the lumen 22, as shown in FIGS. 4c and 4d, the profile of the polarization field $B_O$ on the right-hand boundary of the active region determines the polarity of the NMR signal. In FIG. 4c for example, the excited magnetization indicated at 82 is positive because adiabatic passage occurred from a higher polarizing magnetic field $B_O$, whereas in FIG. 4d the excited magnetization 83 is negative because flow is from a region of lower polarizing magnetic field $B_O$.

Referring particularly to FIGS. 5a-5c, the shape of the excited magnetization $M_1(x)$ produced by the paramagnetic nuclei as they flow through the active region is determined by the magnitude of the flowing material and its velocity. The magnitude of excited magnetization $M_1(x)$ at any point along the x axis in the active region is determined by the number of transversely polarized paramagnetic nuclei at that point and the magnitude of their transverse magnetic moments $M_1$. While traversing the active region the flowing paramagnetic nuclei are in an adiabatic spin-locked condition in which they undergo a relaxation toward their thermodynamic equilibrium through environmental interactions. As a result, their transverse magnetic moment $M_1$ decays as a function of time as they traverse the active region. The rate $T_a$ at which the transverse magnetization $M_1$ decays as a result of this phenomenon lies between the well-known spin-spin relaxation constant $T_2$ and the spin-lattice relaxation constant $T_1$. Because $T_1$ and $T_2$ are not vastly different in blood, $T_a$ has approximately this same value in the present application.

As shown in FIG. 5a, when the paramagnetic nuclei are moving rapidly through the active region after passing through the adiabatic passage region, they still have considerable transverse magnetization $M_1$ when they exit through the opposite boundary. The emf induced in the receiver coil 30 is proportional to the area 84 under this curve, and in FIG. 5a it is substantial.

As shown in FIGS. 5b and 5c, however, when the paramagnetic nuclei are flowing at slower rates, they are totally relaxed before exiting the active region. The resulting excited magnetization $M_1(x)$ drops off sooner as a function of distance, and the emf induced in the receiver coil 30 declines as a function of the flow rate as indicated by the respective cross hatched areas 85 and 86. The magnitude of the NMR signal received by the coil 30 over the active region is thus a function of the flow of the paramagnetic nuclei.

The blood flowing in a limb is not a simple system, but is instead, made up of a number of components. In addition, quiescent tissues which surround the veins and arteries may contribute to the received NMR signal. And, anomolies in the various fields produced by the blood flowmeter introduce erroneous information, or noise, into the received NMR signals.

To measure the various components of blood flow and to compensate for anomolies and signals produced by stationary tissue, a sequence of measurements are taken in which the $B_O$ profiles are switched to different configurations. These $B_O$ profile configurations are illustrated in FIGS. 6a–6d and are designated respectively as: even plus (E+); even minus (E−); odd minus (O−); and odd plus (O+).

The NMR signal S(t) which is received at the coil 30 when measuring blood flow through a limb may be expressed as follows:

$$S(t) = S_T + V_a(a + b \sin \omega_p t) + V_v \quad (1)$$

where:
$S_T$ = signal due to quiescent tissue & anomolies
$V_a$ = arterial volume blood flow
a = constant indicating the magnitude of the constant flow component of arterial flow
b = constant indicating the magnitude of the pulsatile component of arterial flow
$\omega_p$ = pulse rate
$V_v$ = venous volume blood flow The separate components of this complex blood flow may be measured by the following sequence. First, the NMR signal received by the coil 30 when an even plus $B_O$ profile (FIG. 6a) is applied, is digitized and stored in the processor 284.

$$S_{E+} = S_t + V_a(a + b \sin \omega_p t) + V_v \quad (2)$$

The $B_O$ profile is then switched to an O—profile (FIG. 6c) which yields an NMR signal as follows:

$$S_{O-} = S_T - V_a(a + b \sin \omega_p t) + V_v \quad (3)$$

The $B_O$ profile is again switched to an O+ profile (FIG. 6d) and the following NMR signal is received, digitized and stored:

$$S_{O+} = S_T + V_a(a + b \sin \omega_p t) - V_v \quad (4)$$

These signals which are stored in digital form may then be processed to produce an indication of the arterial and venous flow. For arterial flow a simple arithmetic operation is performed on the data from equations (2) and (3) as follows:

$$S_A = S_{E+} - S_{O-} = 2V_a(a + b \sin \omega_p t) \quad (5)$$

$$V_a = S_A/2a + S_A/2b \sin \omega_p t$$

The pulsatile component of arterial flow in this expression can be determined by making a number of measurements which are gated at different times during the cardiac cycle. From such measurements the values of the constants a and b can be determined.

A similar arithmetic operation is performed on the stored data to arrive at the magnitude of venous flow:

$$S_v = S_{E+} - S_{O+} = 2V_v \quad (6)$$

$$V_v = S_v/2$$

It should be apparent that the above measurement cycles can be repeated to provide values of the various blood flow components throughout a cross section of the limb placed in the lumen 22. These can be displayed as separate images, or they can be combined to form an image of the composite blood flow through the cross section.

We claim:

1. In an NMR flowmeter which measures flow through an active region by applying a polarizing magnetic field having a relatively fixed magnitude in the active region and by applying a transverse excitation field within the active region to produce transverse magnetization in paramagnetic nuclei located in the active region, and receiving the signal produced by the transversely magnetized paramagnetic nuclei, the improved method comprising:
   applying a first contoured polarizing magnetic field at one boundary of the active region such that paramagnetic nuclei flowing into said active region through said boundary do so from a region of substantially lower polarizing magnetic field strength;
   receiving a first signal produced by the paramagnetic nuclei in the active region;
   applying a second contoured polarizing magnetic field at said one boundary of the active region such that paramagnetic nuclei flowing into said active region through said boundary do so from a region of substantially higher polarizing magnetic field strength;
   receiving a second signal produced by the paramagnetic nuclei in the active region; and
   arithmetically combining the first and second signals to produce flow information.

2. The improvement as recited in claim 1 in which the first and second contoured polarizing magnetic fields each define an adiabatic passage region at said one boundary.

3. The improvement as recited in claim 2 in which the strength of the polarizing magnetic field changes in the adiabatic passage region at a rate less than ten gauss per centimeter.

4. The improvement as recited in claim 1 in which the NMR flowmeter measures blood flow and includes means for generating magnetic field gradients which confine the active region to selected blood vessels.

5. An NMR blood flowmeter which comprises:
   means for producing a transverse excitation field in an active region;
   means for receiving an NMR signal produced by transversely magnetized paramagnetic nuclei located in the active region;
   means for producing a contoured polarizing magnetic field including:
   (a) means for producing a relatively constant magnetic field in the active region;
   (b) means for controlling the polarizing magnetic field strength at one boundary of the active region such that paramagnetic nuclei flowing into the active region through said one boundary do so from either a magnetic field which is stronger than said constant magnetic field or which is weaker than said constant magnetic field;

(c) means for controlling the field strength at an opposite boundary of the active region such that paramagnetic nuclei flowing into the active region through said opposite boundary do so from either a magnetic field which is stronger than said constant magnetic field or which is weaker than said constant magnetic field;

means coupled to the means for producing a contoured polarizing magnetic field for making a series of measurements in which different polarizing magnetic field contours are applied and a corresponding set of NMR signals are received from the active region; and means for arithmetically combining the NMR signals in said set to produce a signal indicative of blood flow through the active region.

6. The NMR blood flowmeter as recited in claim 5 in which the transverse excitation field is applied continuously during each measurement.

7. The NMR blood flowmeter as recited in claim 5 in which the rate of change in polarizing magnetic field strength at each of said boundaries is less than ten gauss per centimeter.

8. The NMR blood flowmeter as recited in claim 5 in which the NMR signals in said set are arithmetically combined in a plurality of ways to produce a plurality of signals which are indicative of the various components of complex blood flow.

* * * * *